(12) United States Patent
Huh

(10) Patent No.: US 8,913,427 B2
(45) Date of Patent: Dec. 16, 2014

(54) SEMICONDUCTOR MEMORY DEVICE AND METHOD OF OPERATING THE SAME

(75) Inventor: Hwang Huh, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 78 days.

(21) Appl. No.: 13/602,008

(22) Filed: Aug. 31, 2012

(65) Prior Publication Data

US 2013/0301366 A1   Nov. 14, 2013

(30) Foreign Application Priority Data

May 8, 2012   (KR) .......................... 10-2012-0048770

(51) Int. Cl.
*G11C 11/34*   (2006.01)
(52) U.S. Cl.
USPC .......... 365/185.02; 365/189.011; 365/185.03; 365/185.18
(58) Field of Classification Search
None
See application file for complete search history.

(56) References Cited

U.S. PATENT DOCUMENTS

| | | | |
|---|---|---|---|
| 7,859,902 B2 * | 12/2010 | Maejima | 365/185.11 |
| 2009/0073761 A1 * | 3/2009 | Hemink | 365/185.02 |

\* cited by examiner

*Primary Examiner* — Hoai V Ho
*Assistant Examiner* — Muhammad Islam
(74) *Attorney, Agent, or Firm* — William Park & Associates Patent Ltd.

(57) ABSTRACT

A semiconductor memory device of the present invention includes a memory cell array with cell strings having word lines stacked on a substrate and a vertical channel layer formed through the word lines, a peripheral circuit configured to select one of the word lines and perform a program operation on the selected word line, and a control circuit configured to control the peripheral circuit to perform the program operation by applying a program voltage to a word line selected for the program operation, applying a ground voltage to a word line of which a program operation has been completed and applying a pass voltage to the other word lines.

9 Claims, 5 Drawing Sheets

US 8,913,427 B2

SEMICONDUCTOR MEMORY DEVICE AND METHOD OF OPERATING THE SAME

CROSS-REFERENCE TO RELATED APPLICATION

This application claims priority from Korean Patent Application No. 10-2012-0048770, filed on May 8, 2012, the contents of which are incorporated herein by reference in its entirety.

BACKGROUND

The present invention relates generally to a semiconductor memory device and a method of operating the same.

High density memory has been continuously required since manufacturing techniques for semiconductors have improved. A memory device having three-dimensional structure, where memory cells are vertically stacked on a silicon substrate, has been suggested, since a memory device having two-dimensional structure, where the memory cells are formed with one layer on the silicon substrate is reaching a limit.

However, a problem exists in that a process for three-dimensional structures is unstable and/or the reliability of the memory device has deteriorated in the new three-dimensional structure. Various methods for solving the problem have been suggested.

For example, in the memory device having three-dimensional structure, one bit line is connected to plural cell strings. Accordingly, a problem exists in that the number of times a pass voltage is applied to each word line increases every time a program operation is performed, causing the threshold voltage of the memory cell to change based on the pass voltage.

SUMMARY OF THE INVENTION

Various embodiments of the present invention provides a semiconductor memory device that reduces a disturbance based on the pass voltage by minimizing the number of times a pass voltage is applied to a memory cell not selected when a program operation is performed in the semiconductor memory device having three-dimensional structure, and a method of operating the same.

A semiconductor memory device according to an embodiment of the present invention includes a memory cell array with cell strings having word lines stacked on a substrate and a vertical channel formed through the word lines; a peripheral circuit configured to select one of the word lines and perform a program operation on the selected word line; and a control circuit configured to control the peripheral circuit to perform the program operation by applying a program voltage to a word line selected for the program operation, applying a ground voltage to a word line of which a program operation has been completed and applying a pass voltage to the other word lines.

A method of operating a semiconductor memory device according to another embodiment of the present invention includes applying a ground voltage to a word line, of which a program operation has been completed, among the word lines of a cell string including the word lines stacked on a substrate and a vertical channel formed through the word lines; providing a pass voltage to a word line selected for program operation and the other word lines except the selected word line and a word line of which program operation has been completed; and changing a voltage applied to the selected word line to a program voltage.

A method of operating a semiconductor memory device according to another embodiment of the present invention includes inputting a program command for a selected word line among word lines of a cell string, including the word lines stacked on a substrate and a vertical channel formed through the word lines; applying a ground voltage to word lines disposed between the word line selected for program operation and a source select line; providing a pass voltage to the selected word line and word lines disposed between the selected word line and a drain select line; and changing a voltage applied to the selected word line to a program voltage. A program operation may be performed on the word lines in an order from a word line adjacent to the source select line to a word line in a direction towards a drain select line.

A semiconductor memory device and a method of operating the same according to the present invention minimizes the number of times a pass voltage is applied to a non-selected memory cell when a program operation is performed, thus reducing the disturbance based on the pass voltage.

BRIEF DESCRIPTION OF THE DRAWINGS

The above and other features as well as advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
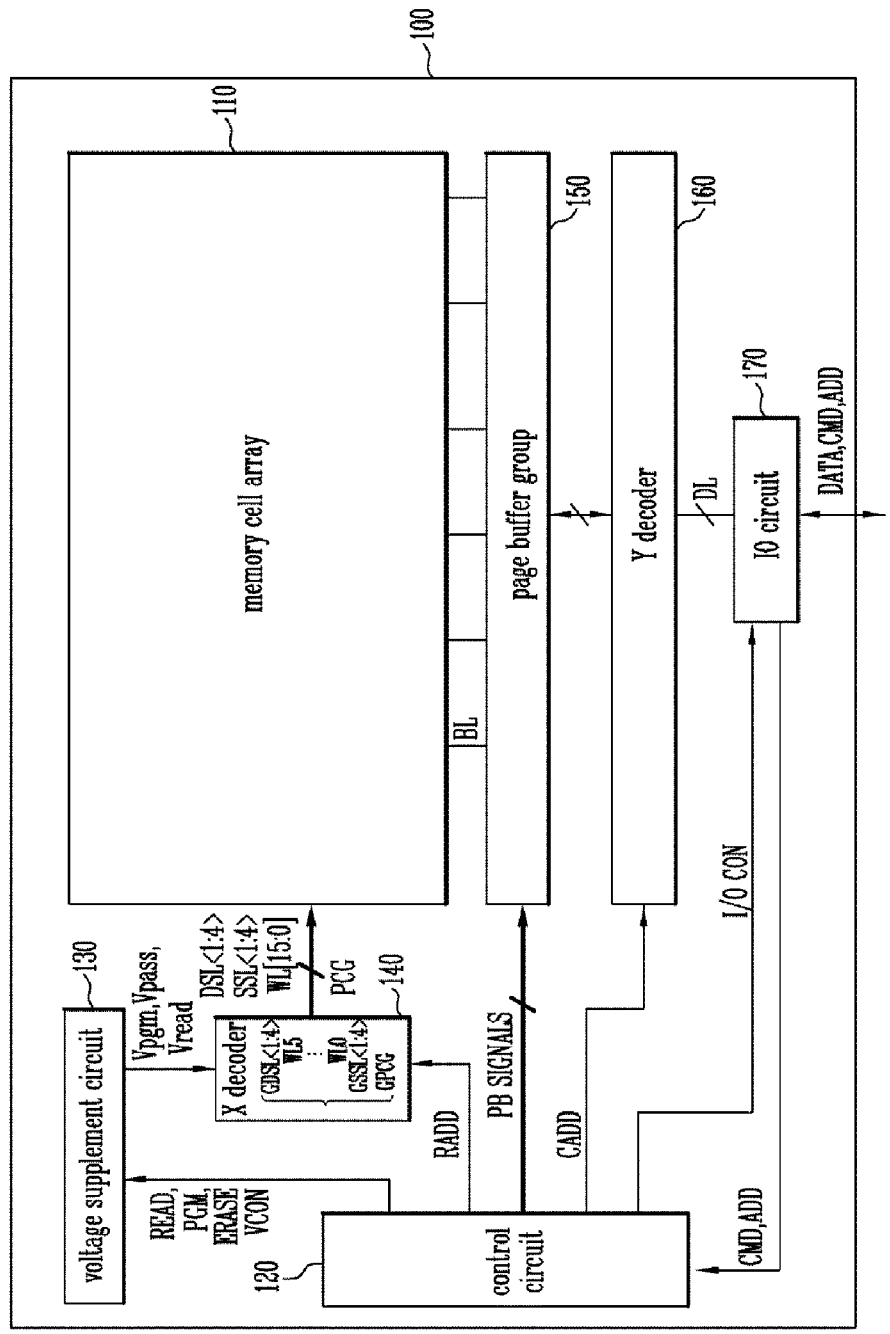
FIG. 1 is a view illustrating a semiconductor memory device according to an embodiment of the present invention.

FIG. 1 is a view illustrating a semiconductor memory device according to an embodiment of the present invention.

In FIG. 1, a semiconductor memory device 100 includes a memory cell array 110 having memory cells.

The memory cell array 110 has three-dimensional structure, and the structure will be described in detail below.

The semiconductor memory device 100 includes a peripheral circuit group 130 to 170 that serves to program the memory cells or read data stored in the memory cell, and a control circuit 120 that serves to control the peripheral circuit group 130 to 170.

The peripheral circuit group 130 to 170 includes a voltage supplement circuit 130, an X decoder 140, a page buffer group 150, a Y decoder 160 and an IO circuit 170.

The voltage supplement circuit 130 generates an operation voltage for programming, reading or erasing, e.g. a program voltage Vpgm, a read voltage Vread, a pass voltage Vpass or an erase voltage Verase, etc. in response to a voltage control signal (VCON) and an operation mode signal PGM, READ, ERASE, etc. outputted from the control circuit 120.

The X decoder 140 selects one memory block BK in the memory cell array 110 according to a row address RADD inputted from the control circuit 120, connects word lines and a select line of a selected memory block BK to global lines, and delivers the operation voltage through the connected lines.

The page buffer group 150 includes page buffers connected to one or more bit lines, and operates in a program operation, a read operation or an erase operation in response to page buffer control signals PB SIGNALS outputted from the control circuit 120.

A three-dimensional structure of the memory cell array 110 is described as follows.

Figure 2:
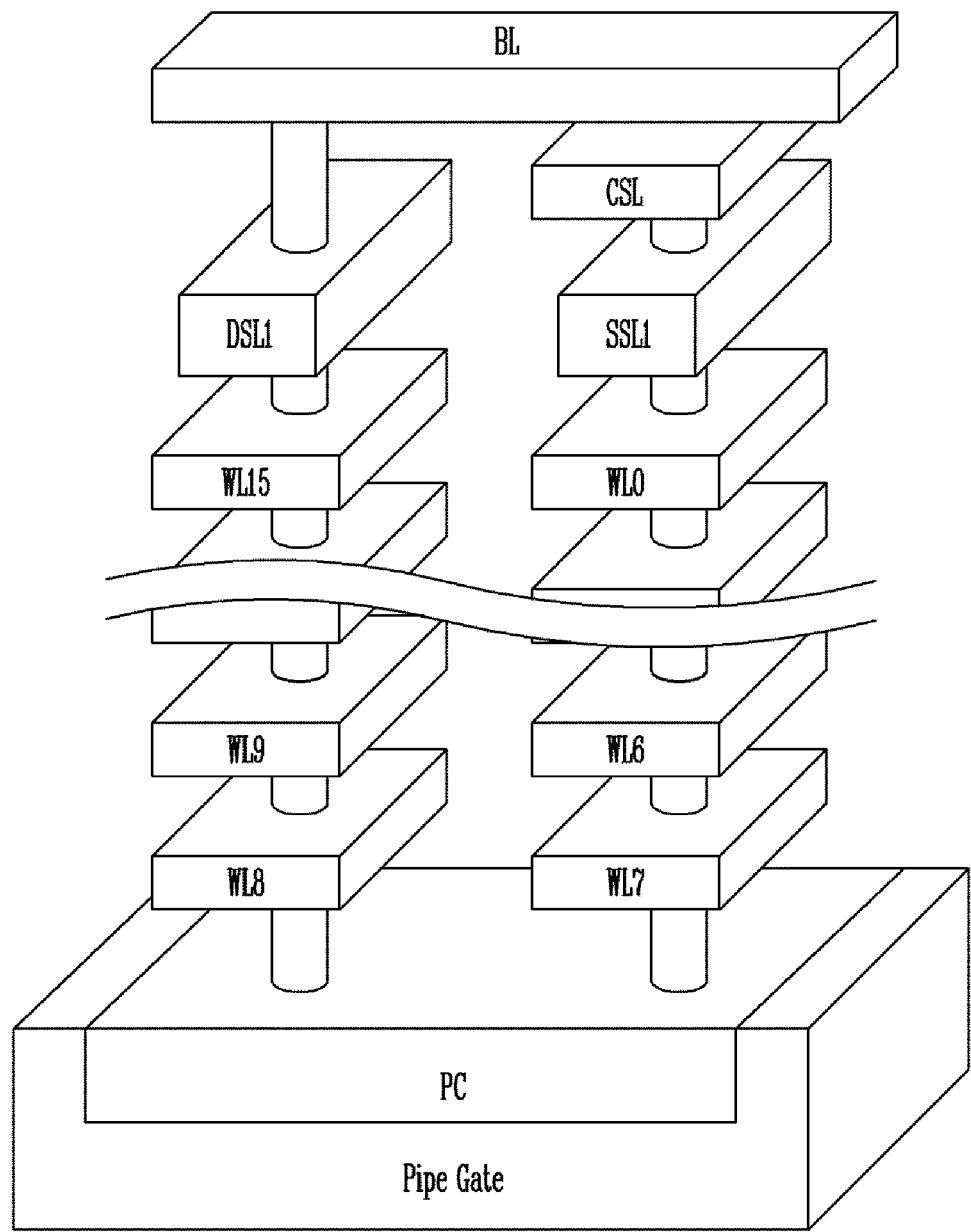
FIG. 2 is a perspective view illustrating a memory cell array in FIG. 1.

FIG. 2 is a perspective view illustrating a memory cell array in FIG. 1.

FIG. 2 shows only one cell string of the memory cell array having three-dimensional structure, illustrating only conduction parts and omitting insulating parts for easy viewing. The structure of the memory cell array having the three-dimensional structure shown in FIG. 2 may be referred to as a P-Bics structure.

Referring to FIG. 2, a PC is formed on a pipe gate, a U-shape pillar is formed on the PC, and a 0th to seventh word lines WL0 to WL7 and an eighth to a fifteenth word lines WL8 to WL15 are stacked vertically on the pillar.

A drain select line DSL1 and a source select line SSL1 surround the pillar and are respectively disposed in a horizontal direction.

A connection part of the 0th to the fifteenth word lines WL0 to WL15 and the pillar corresponds to a trap charge typed memory cell, a connection part of a drain select line and the pillar corresponds to a drain select transistor, and a connection part of a source select line and the pillar corresponds to a source select transistor. The U-shape pillar functions as a channel. An end of the pillar corresponding to the source select transistor is connected to a common source line CSL. Each cell string shares the common source line.

The PC is connected with the U-shape pillars, and may operate as one cell string only when the pillars are electrically connected by providing power to the pipe gate.

The memory cell array 110 having a three-dimensional structure is a multi string structure where two or more cell strings may connect to bit line BL.

Figure 3:
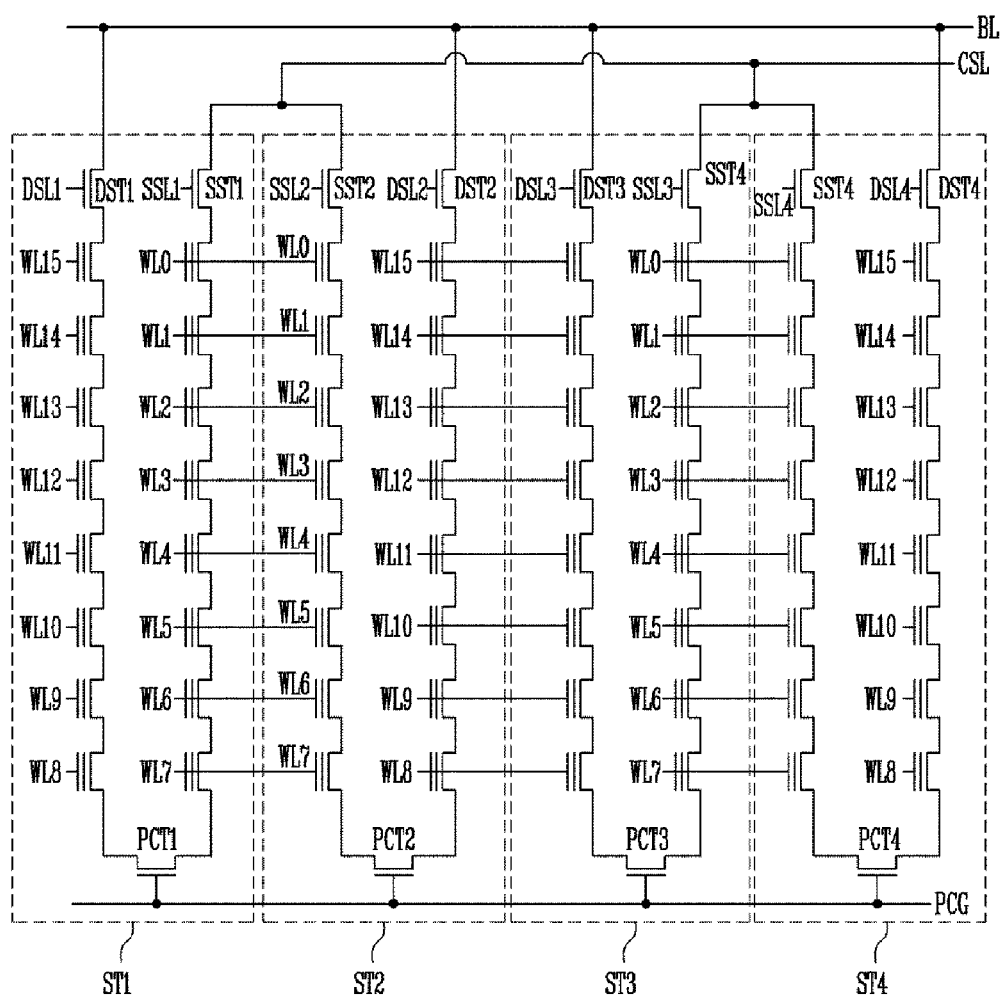
FIG. 3 is a view illustrating cell strings connected to one bit line.

The memory cell array 110 where four cell strings are connected to one bit line may be illustrated using the following two-dimensional circuit of FIG. 3.

FIG. 3 is a view illustrating cell strings connected to one bit line.

In FIG. 3, four cell strings ST1 to ST4 are connected to one bit line BL.

The cell strings have the same structure, and a first cell strings ST1 will be described and be representative of the other cell strings.

In the cell string ST1, a 0th to a seventh memory cells C0 to C7 (not shown), a pipe control transistor PCT1 and an eighth to a fifteenth memory cells C8 to C15 (not shown) are connected in serial between a first source select transistor SST1 and a first drain select transistor DST1.

A gate of the first source select transistor SST1 is connected to a first source select line SSL1, and a gate of the first drain select transistor DST1 is connected to a first drain select line DSL1.

The 0th to the fifteenth memory cells C0 to C15 (not shown) are respectively connected to 0th to fifteenth word lines WL0 to WL15, and a gate of the pipe control transistor PCT1 is connected to a pipe control gate PCG.

Circuits of the second to the fourth cell strings ST2 to ST4 are similar to that of the first cell string ST1. Gates of the second to the fourth source select transistors SST2 to SST4 connected to the second to the fourth cell strings ST2 to ST4 are connected to second to fourth source select lines SSL2 to SSL4, and gates of a second to a fourth drain select transistors DST2 to DST4 are connected to second to fourth drain select lines DSL2 to DSL4.

Drains of the first to the fourth drain select transistors DST1 to DST4 are connected to a common bit line BL, and sources of the first to the fourth source select transistors SST1 to SST4 are connected to a common source line CSL.

Every pipe control transistor PCT maintains a turned-on state when the program operation, read operation or erase operation is performed.

The pass voltage Vpass is applied to the all word lines except the selected word line when the program operation of the semiconductor memory device is performed. The greater the number of times the pass voltage Vpass is applied, the more disturbances there are due to the pass voltage Vpass.

In a three-dimensional memory device, four cell strings are connected to one bit line, and the number of times the pass voltage Vpass is applied to the word line in the program operation is greater than in a two-dimensional memory device because the cell strings share the word line.

Figure 4:
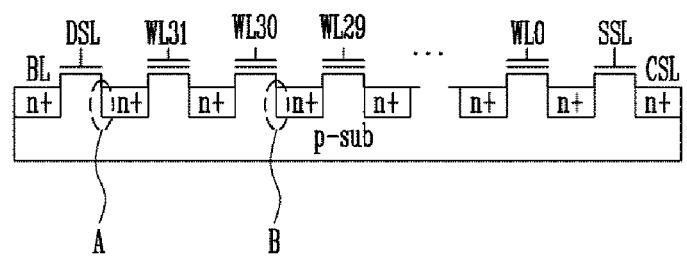
FIG. 4 is a view illustrating a program operation of a semiconductor memory device having two-dimensional structure.

FIG. 4 is a view illustrating a program operation of a two-dimensional semiconductor memory device.

FIG. 4 shows a schematic section of a cell string of the two-dimensional semiconductor memory device.

In FIG. 4, a junction exists between memory cells in the cell string.

A floating gate and a control gate of the memory cell are formed between 'n+' junctions on a substrate p-sub.

When a program operation is performed, a program voltage Vpgm is applied to a selected word line for program operation, and a pass voltage Vpass is provided to unselected word lines.

Since the junction exists between the memory cells, a problem exists in that gate induced drain leakage GIDL current (not shown) occurs in the case that a reverse voltage is applied between a drain and a source at area 'A' in FIG. 4. Electrical characteristics of the memory cell may deteriorate because hot carrier injection occurs at an area 'B' in FIG. 4. Accordingly, the pass voltage Vpass should be applied to a non-selected word line of which programming is completed, or a channel cut voltage or a buffer voltage should be provided.

Structure of a three-dimensional cell string is described as follows.

Figure 5:
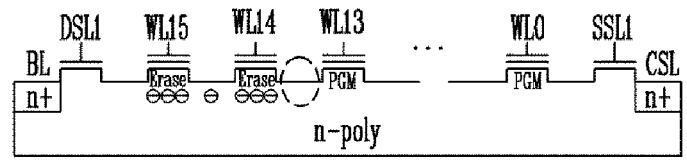
FIG. 5 is a view illustrating a cell string having three-dimensional structure in a semiconductor memory device according to an embodiment of the present invention.

FIG. 5 is a view illustrating a three-dimensional cell string in a semiconductor memory device according to an embodiment of the present invention.

As shown in FIG. 5, in the cell string of the semiconductor memory device, word lines are formed without junction on a n-poly channel having a thickness of approximately 10 nm. The amount of electrons trapped on a contact area between the n-poly channel and the word line is adjusted, and so the threshold voltage of the memory cell is controlled.

Since a junction does not exist between the memory cells in the cell string, adjoining fringing field effect is used to form a channel between the memory cells. The fringing field effect describes a phenomenon where an electric field is generated due to a potential difference of adjoining gate areas when electrons shift from an area having small potential to an area having high potential according to the generated electric field.

Since a junction does not exist in the cell string, the possibility that an HCI phenomenon occurs may be reduced.

The present invention provides a method of reducing the number of times a pass voltage is applied to a word line in a program operation using the above technique.

Figure 6:
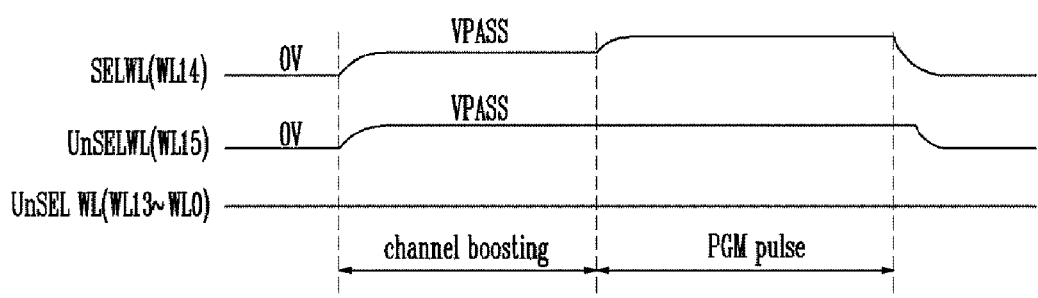
FIG. 6 is a timing diagram illustrating a program operation according to an embodiment of the present invention.

FIG. 6 is a timing diagram illustrating a program operation according to an embodiment of the present invention.

The program operation will be described with reference to drawings FIG. 5 and FIG. 6.

In the cell string in FIG. 5, a program of a 0th to a thirteenth word lines WL0 to WL13 is completed, and fourteenth and fifteenth word lines WL14 and WL15 are in an erase state without being programmed.

When a program operation is performed on the fourteenth word line WL14, a pass voltage Vpass is applied to the fifteenth word line WL15 as shown in FIG. 5 and FIG. 6, a pass voltage Vpass is provided to the fourteenth word line WL14, and 0V is applied to the 0th to the thirteenth word lines WL0 to WL13.

The pass voltage Vpass is applied to the non-selected word line Unsel WL which is disposed in a direction from the selected word line Sel WL for program towards the drain select line DSL and connected to memory cells not programmed.

0V is applied to the non-selected word line Unsel WL which is disposed in a direction from the selected word line Sel WL towards the source select line SSL and programmed in advance.

Since 0V instead of the pass voltage Vpass is applied to the programmed word line, the number of times the pass voltage Vpass is applied is reduced, and so disturbances due to the pass voltage Vpass are reduced. This method may be performed because the possibility that HCI occurs in a three-dimensional cell string which does not include a junction is low.

In FIG. 6, 0V is applied to every word line before the program operation is started, and the pass voltage Vpass is provided to the selected word line for channel boosting and the non-selected word lines disposed in a direction from the selected word line towards the drain select line. 0V is applied continuously to the non-selected word line disposed in a direction from the selected word line towards the source select line.

When a program pulse is provided, only a voltage applied to the selected word line is changed from the pass voltage Vpass to the program voltage Vpgm.

In the above operation method, the number of times the pass voltage Vpass is applied is different depending on location of the word lines.

For example, if the 0th word line WL0 to the fifteenth word line WL15 in one cell string are selected and programmed in sequence, the number of times the pass voltage Vpass is applied to the 0th word line WL0 is 0 because the 0th word line is firstly programmed.

In contrast, since the fifteenth word line WL15 is lastly programmed, the number of times the pass voltage Vpass is applied to the fifteenth word line WL15 is 14.

Since four cell strings are connected to one bit line, the number of times the pass voltage Vpass is applied to the word lines is increased. However, the number of times the pass voltage Vpass is applied in the present invention may decrease considerably compared with the convention technique in which the number of times the pass voltage Vpass is applied to each of the word lines is 14.

As described above, when the number of times the pass voltage Vpass is applied is reduced, and disturbance due to the pass voltage Vpass may be reduced. Additionally, since the pass voltage Vpass is not provided to the word line of which program operation has been completed, current consumed when applying the pass voltage Vpass may also be reduced.

A program method of the three-dimensional semiconductor memory device different from the P-Bics structure may be similar as that of the P-Bics structure in FIG. 2.

Figure 7:
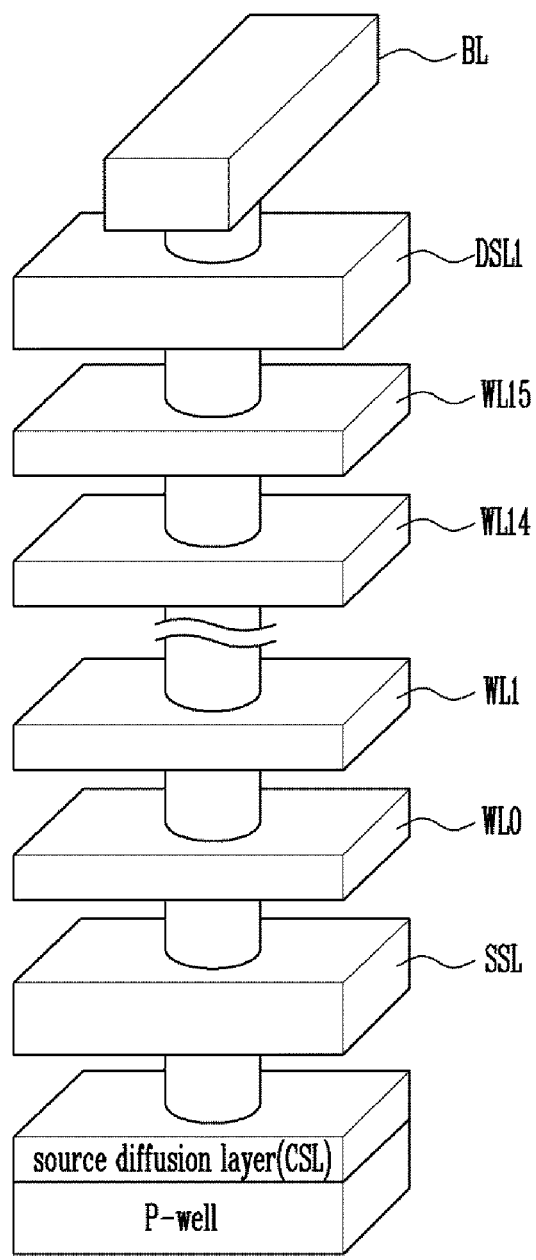
FIG. 7 is a view illustrating a semiconductor memory device having three-dimensional structure according to an embodiment of the present invention.

FIG. 7 is a view illustrating a three-dimensional semiconductor memory device according to an embodiment of the present invention.

FIG. 7 shows one cell string included in the semiconductor memory device as a Bics structure.

In FIG. 7, only one cell string connected to a bit line BL is shown. Plural cell strings are connected to one bit line like in the semiconductor memory device in FIG. 2.

Referring to FIG. 7, a source diffusion layer CSL operating as a common source line is formed on a P-well, and a source select transistor, a 0th to a fifteenth memory cells, and a drain select transistor are stacked along a pillar typed channel.

The source select transistor is connected to a source select line SSL, the 0th to the fifteenth word lines WL0 to WL15 are connected to corresponding memory cells, and the drain select transistor is connected to a drain select line DSL1. The drain select lines DSL1 of the cell strings connected to the same bit line are separated.

Unlike the cell strings in FIG. 2, the source select lines SSL of the cell string in FIG. 7 are commonly connected. However, the source select lines SSL of the cell strings may be separated in a process of manufacturing the semiconductor memory device.

The drain select lines DSL1 of the cell strings are separated and are differently connected.

No transistor is required on a PC, and the 0th memory cell C0 to the fifteenth memory cell C15 are stacked in sequence.

A TCAT structure is one of the semiconductor memory devices having a three-dimensional structure. The TCAT structure is similar to the structure in FIG. 7. Materials and a process for manufacturing a memory cell in the TCAT structure is different from those in FIG. 7. However, the circuit and operation of the TCAT structure are similar to those of P-Bics in FIG. 7.

New semiconductor memory devices having three-dimensional structure have been developed.

The program method of the present invention may be applied to various three-dimensional semiconductor memory devices.

The semiconductor memory devices may reduce the number by times the pass voltage is applied to the memory cell through the method of applying the program voltage to the selected word line, providing a ground voltage to the programmed word line, and applying the pass voltage to the non-selected word line of which a program operation is not performed.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A semiconductor memory device comprising:
a memory cell array with cell strings having word lines stacked on a substrate and a vertical channel formed through the word lines;
a peripheral circuit configured to select one of the word lines and perform a program operation on the selected word line; and
a control circuit configured to control the peripheral circuit to perform the program operation by applying a ground voltage to a first group of word lines coupled to memory cells of which a program operation has been completed, applying a pass voltage to a second group of word lines coupled to memory cells of which a program operation has not been completed, and applying a program voltage to the selected word line coupled to selected memory cells.

2. The semiconductor memory device of claim 1, wherein the control circuit controls the peripheral circuit so that the pass voltage is applied to the second group of word lines and the selected word line and then the pass voltage applied to the selected word line is changed to the program voltage when the program operation is performed.

3. The semiconductor memory device of claim 1, wherein the control circuit controls the peripheral circuit to perform the program operation in an order from the word line adjacent to a source select line to the word line adjacent to a drain select line.

4. The semiconductor memory device of claim 3, wherein the first group of word lines are disposed between the selected word line and the source select line.

5. The semiconductor memory device of claim 3, wherein the second group of word lines are disposed between the selected word line and the drain select line.

6. A method of operating a semiconductor memory device, the method comprising:
applying a ground voltage to a first group of word lines coupled to memory cells of which a program operation has been completed;
applying a pass voltage to a second group of word lines and a selected word line, wherein the second group of word lines are coupled to memory cells of which a program operation has not been completed, and the selected word line is coupled to selected memory cells; and
applying a program voltage to the selected word line.

7. The method of claim 6, wherein the first group of the word lines are disposed between the selected word line and a source select line.

8. The method of claim 6, wherein the second group of the word lines are disposed between the selected word line and a drain select line.

9. A method of operating a semiconductor memory device, the method comprising:
applying a ground voltage to word lines coupled to memory cells of which a program operation has been completed during a program operation by applying a program voltage to a selected word line and a pass voltage to remaining word lines,
wherein the program operation is performed on the word lines in an order from a word line adjacent to a source select line to a word line adjacent to a drain select line.

* * * * *